(12) United States Patent
Chen

(10) Patent No.: US 8,436,472 B2
(45) Date of Patent: May 7, 2013

(54) CORNER STRESS RELEASE STRUCTURE DESIGN FOR INCREASING CIRCUIT ROUTING AREAS

(75) Inventor: Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 322 days.

(21) Appl. No.: 12/702,831

(22) Filed: Feb. 9, 2010

(65) Prior Publication Data
US 2011/0193198 A1     Aug. 11, 2011

(51) Int. Cl.
*H01L 23/48* (2006.01)
(52) U.S. Cl.
USPC ............ 257/774; 257/620; 257/758; 438/460
(58) Field of Classification Search .................. 257/620, 257/758, 774; 438/460
See application file for complete search history.

(56) References Cited

U.S. PATENT DOCUMENTS

| | | | |
|---|---|---|---|
| 7,202,550 B2 * | 4/2007 | Fu et al. .......................... | 257/620 |
| 7,378,720 B2 * | 5/2008 | Fu et al. .......................... | 257/620 |
| 2004/0084777 A1 * | 5/2004 | Yamanoue et al. ............ | 257/758 |
| 2005/0263855 A1 * | 12/2005 | Fu et al. .......................... | 257/620 |
| 2007/0018331 A1 * | 1/2007 | Chen ............................. | 257/774 |
| 2007/0187845 A1 * | 8/2007 | Fu et al. .......................... | 257/797 |
| 2008/0299708 A1 * | 12/2008 | Tsutsue ......................... | 438/121 |
| 2009/0115024 A1 * | 5/2009 | Jeng et al. ..................... | 257/620 |
| 2009/0321890 A1 * | 12/2009 | Jeng et al. ..................... | 257/620 |

* cited by examiner

*Primary Examiner* — Jae Lee
(74) *Attorney, Agent, or Firm* — Slater & Matsil, L.L.P.

(57) ABSTRACT

An integrated circuit structure includes a semiconductor chip, which further includes a corner and a seal ring dispatched adjacent edges of the semiconductor chip; and a corner stress release (CSR) structure adjacent the corner and physically adjoining the seal ring. The CSR structure includes a portion in a top metallization layer. A circuit component selected from the group consisting essentially of an interconnect structure and an active circuit is directly underlying the CSR structure.

17 Claims, 6 Drawing Sheets

CORNER STRESS RELEASE STRUCTURE DESIGN FOR INCREASING CIRCUIT ROUTING AREAS

TECHNICAL FIELD

This disclosure relates generally to integrated circuits and more particularly to the chip design involving corner stress release (CSR) structures.

BACKGROUND

Seal ring formation is an important part in the back-end of semiconductor processes. Seal rings are stress protection structures around integrated circuits, protecting the internal circuit inside semiconductor chips from the damage caused by the sawing of the semiconductor chips from wafers. Further, seal rings may prevent moisture from penetrating into the semiconductor chips. Typical seal rings are usually formed of interconnected metal lines and vias, and are formed adjacent to scribe lines, which are sometimes referred to as dicing lines. Integrated circuits are formed on the inner side of the seal rings.

Because of the provision of seal rings and passivation layers, the circuit regions on the inner side of the seal rings are protected from the influence of external environments, which may cause cracking in the semiconductor chips, thus it is possible to ensure stability of properties of the semiconductor device over a long period of time.

When the wafers are sawed, high mechanical stresses may be applied to, and may damage, the seal rings. To increase the strength of the seal rings, corner stress release (CSR) structures may be formed at the corners of the semiconductor chips. The CSR structures are additional metal lines and vias that are formed simultaneously with the formation of seal rings, and physically join the seal rings. With the formation of the CSR structures, more metal structures exist at the corner regions, which typically have greater stresses than other regions of the semiconductor chips. The stresses applied to the seal rings may thus be spread to more metal structures, and hence the respective seal rings are less likely to be damaged by the stresses.

SUMMARY

In accordance with one aspect, an integrated circuit structure includes a semiconductor chip, which further includes a corner and a seal ring dispatched adjacent edges of the semiconductor chip; and a corner stress release (CSR) structure adjacent the corner and physically adjoining the seal ring. The CSR structure includes a portion in a top metallization layer. A circuit component selected from the group consisting essentially of an interconnect structure and an active circuit is directly underlying the CSR structure.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

Figure 4:
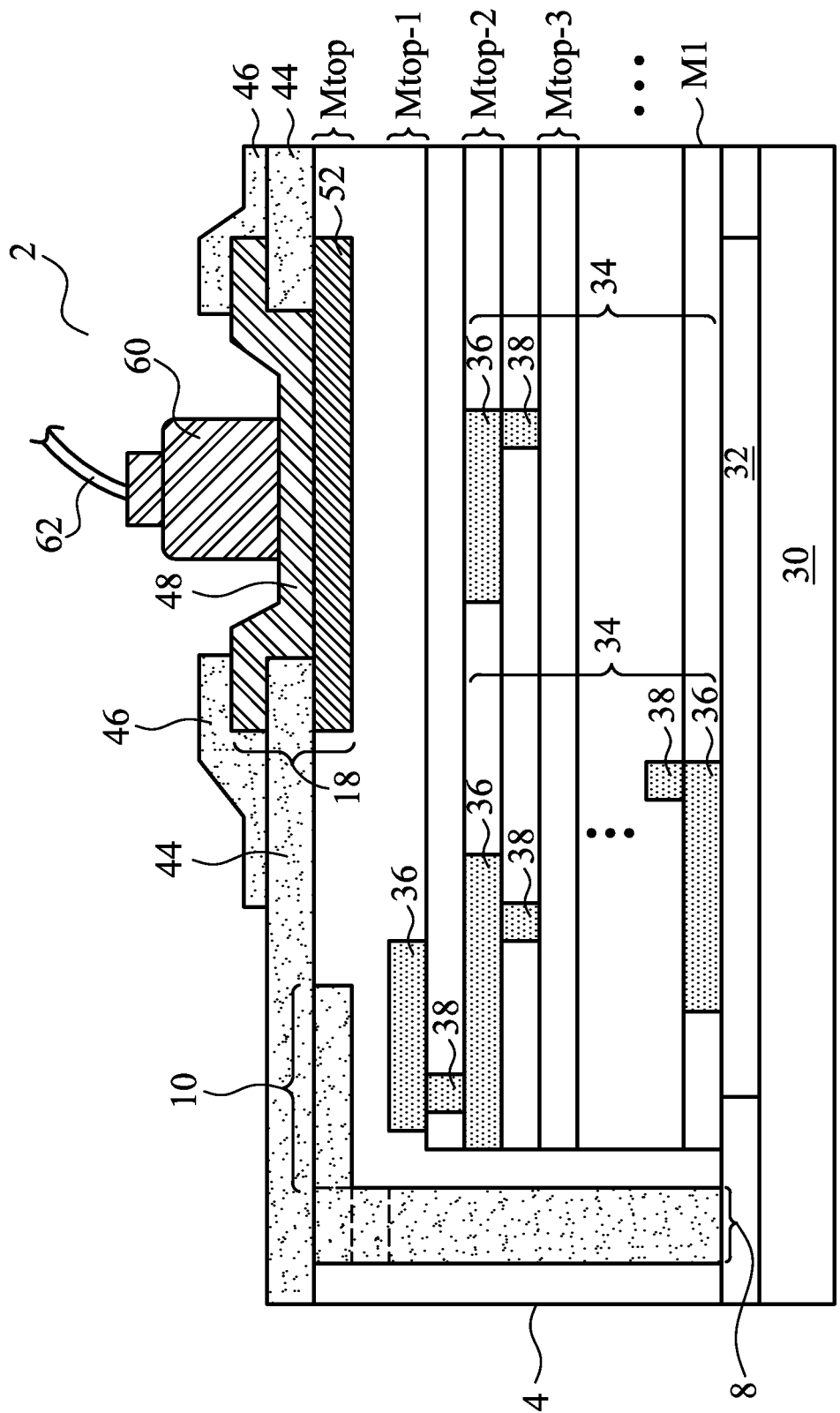
FIGS. 4 and 5 are cross-sectional views of the structure shown in FIG. 1A or 1B in accordance with alternative embodiments.
Figure 5:
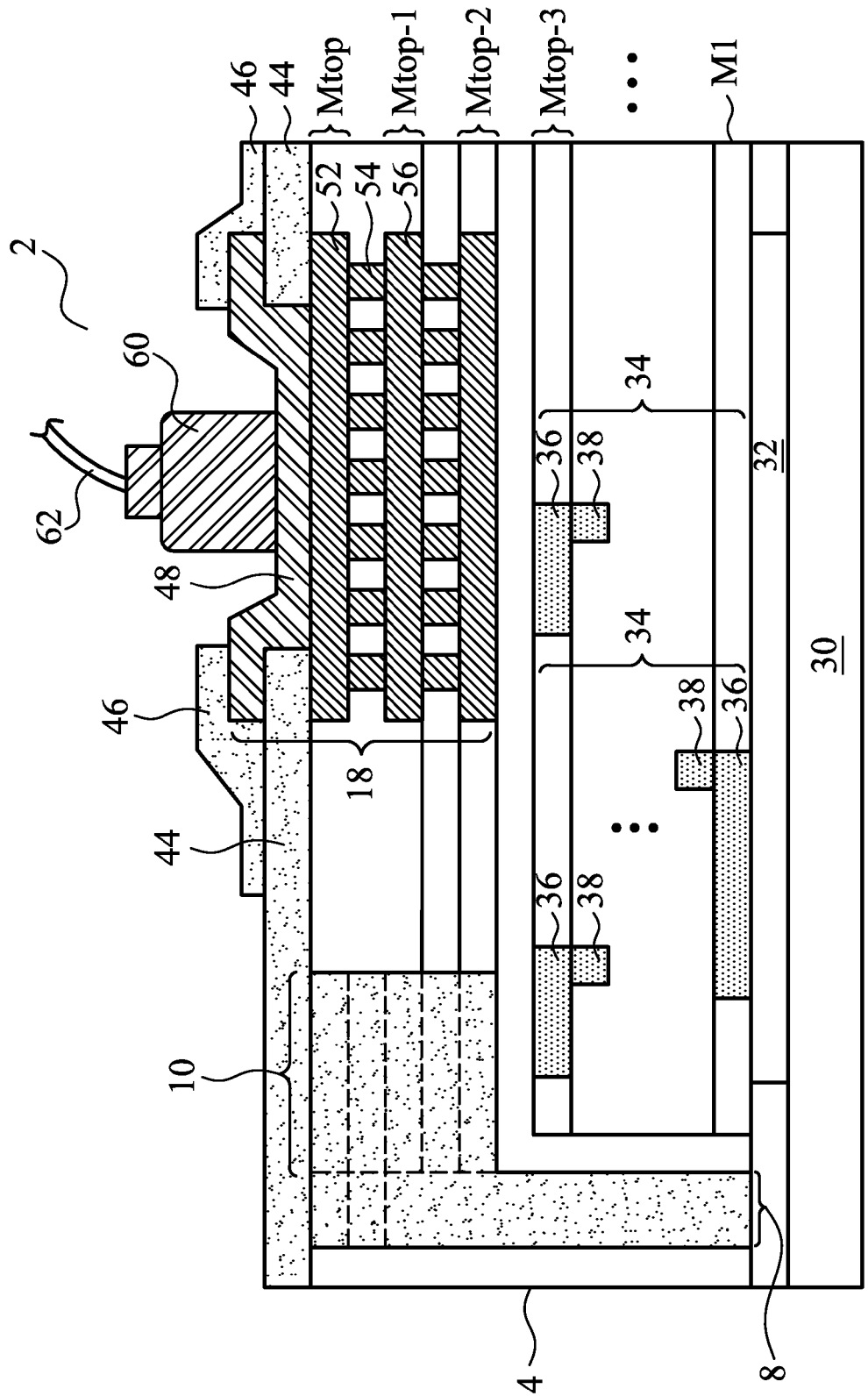

FIG. 1 illustrates a top view of a portion of semiconductor chip 2, which includes edges 4 perpendicular to each other and corner 6. Although not shown in entirety, semiconductor chip 2 may have a rectangular shape including four edges, with edges 4 being two of the edges. Seal ring(s) 8 is formed adjacent edges 4 of semiconductor chip 2. Accordingly, seal ring 8 may include four sides, each proximate one of edges 4 of semiconductor chip 2. At corner 6, seal ring 8 may not (or may) form a 90 degree angle. Instead, a diagonal portion 8_3 may be included. In an embodiment, seal ring 8 is formed of metal lines and vias extending throughout a plurality of dielectric layers including, but not limited to, layers M1 through Mtop, as shown in FIGS. 2, 4, and 5. The metal lines and vias in seal ring 8 form continuous metal walls (refer to FIG. 2), so that detrimental substances, such as moisture, may be blocked outside of seal ring 8. It is appreciated that although only one seal ring 8 is illustrated, seal ring(s) 8 may be in the form of a plurality of seal rings, with the outer seal ring(s) encircling inner seal ring(s).

Corner stress release (CSR) structure 10 may be formed adjacent to corner 6 in addition to the original seal ring 8 to increase the strength of seal ring 8. For example, referring to FIG. 1A, CSR structure 10 may be metal features with the two opposite ends being connected to sides of seal ring 8. Alternatively, as shown in FIG. 1B, CSR structure 10 may form a solid pad with the corner portions of seal ring 8. CSR structure 10 and seal ring 8 may be formed simultaneously, and hence are formed of a same material, and form a continuous region.

Bond pads 18 may also be formed at the surface of semiconductor chip 2. In an embodiment, bond pads 18 are formed on the inner sides (the sides closer to the center of semiconductor chip 2) of seal ring 8, and may be aligned into lines parallel to seal ring sides such as 8_1 and 8_2.

Figure 1A:
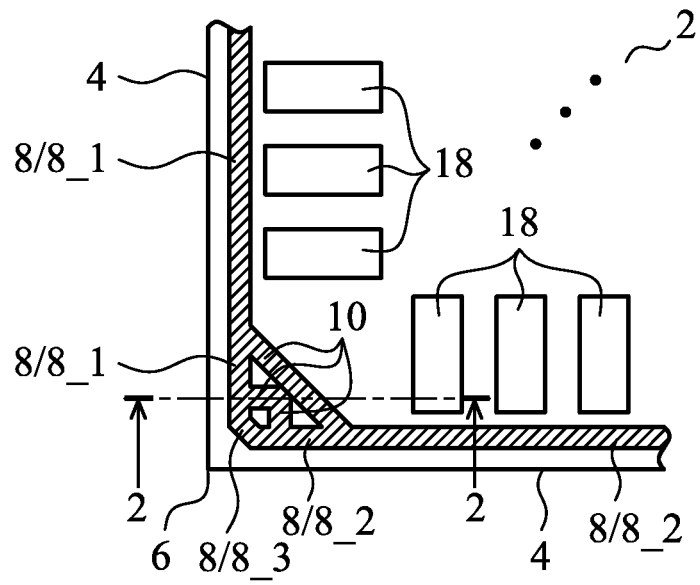
FIGS. 1A and 1B are top views of seal rings and corner stress release (CSR) structures of semiconductor chips in accordance with an embodiment.
Figure 1B:
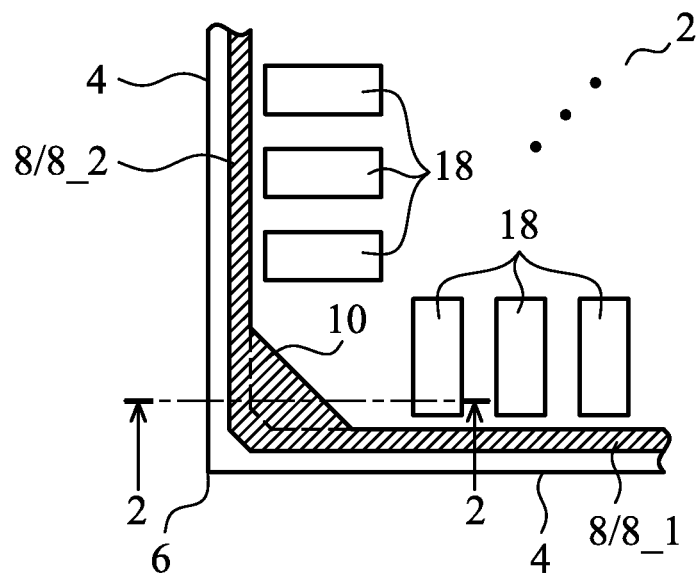
Figure 2:
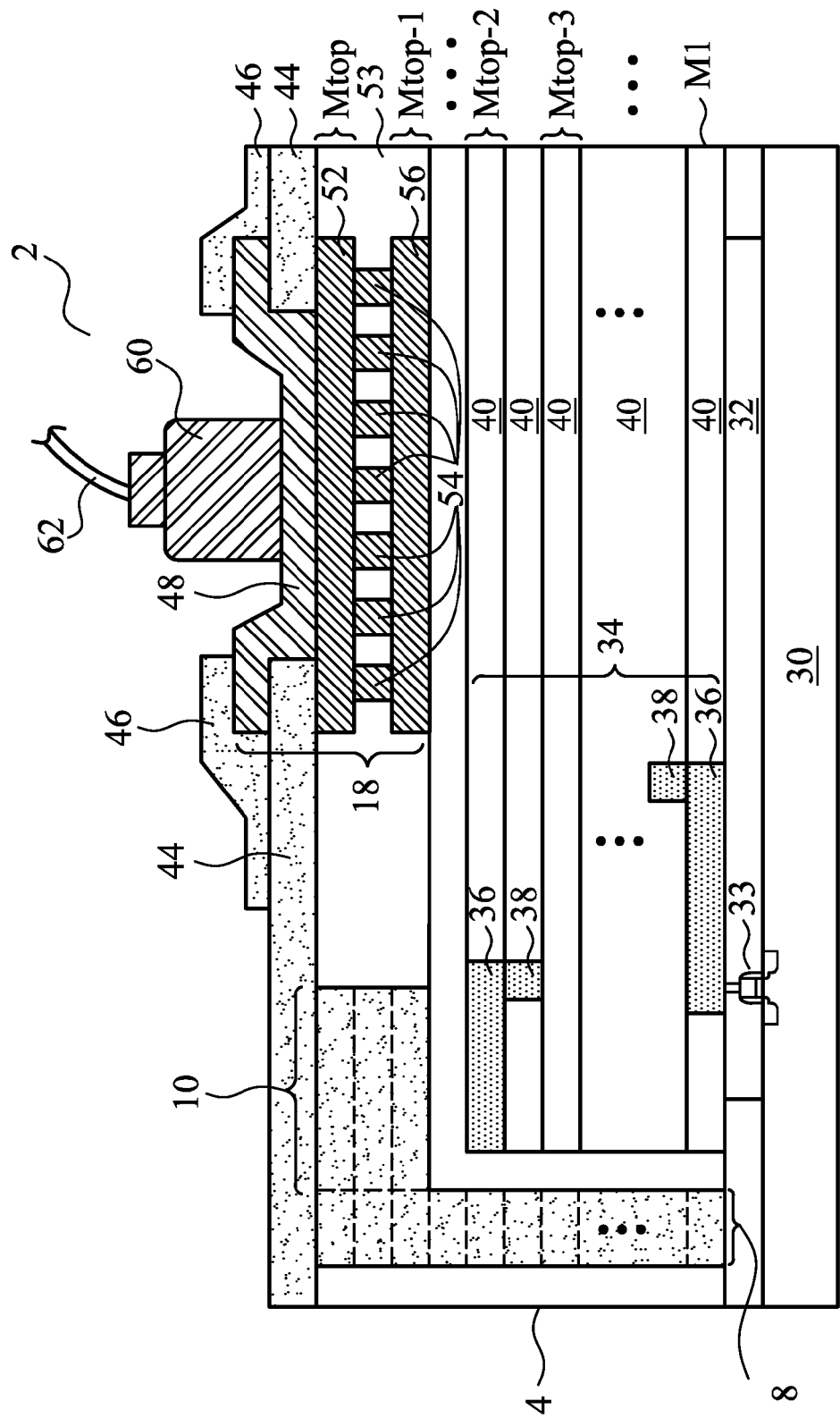
FIG. 2 is a cross-sectional view of the structure shown in FIG. 1A or 1B.

FIG. 2 illustrates a cross-sectional view of semiconductor chip 2, wherein the cross-sectional view is taken along line 2-2 in FIG. 1A or FIG. 1B. As shown in the cross-sectional view, semiconductor chip 2 may include semiconductor substrate 30, on which active circuit 32 is formed. Substrate 30 may be a semiconductor substrate formed of commonly used semiconductor materials, such as silicon, silicon germanium, or the like. Active circuit 32 may include complementary metal-oxide-semiconductor (CMOS) transistors (symbolized by transistor 33), resistors, capacitors, and the like. In an exemplary embodiment, active circuit 32 is an input/output (IO) circuit. Interconnect structure 34 is formed over active circuit 32, and is used to interconnect active circuit 32, and to connect active circuit 32 to bond pads 18. Interconnect structure 34 includes a plurality of metallization layers comprising metal lines 36 and vias 38, which are formed in a plurality of dielectric layers 40. Dielectric layers 40 may be formed of low-k dielectric materials having k values lower than about 2.5, or even lower than about 2.0, for example.

In an embodiment, passivation layers 44 and 46 are formed over dielectric layers 40. Passivation layers 44 and 46 are commonly referred to in the art as being passivation-1 and passivation-2, respectively, and may be formed of materials, such as silicon oxide, silicon nitride, un-doped silicate glass (USG), polyimide, and/or multi-layers thereof. Metal pad 48 is formed on/in one or both of passivation layers 44 and 46. In an exemplary embodiment, metal pad 48 may have a lower portion in an opening in passivation layer 46 and an upper portion over passivation layer 44. Metal pad 48 may comprise aluminum, and hence may also be referred to as aluminum pad 48, although it may also be formed of, or include, other materials such as copper, silver, gold, nickel, tungsten, alloys thereof, and/or multi-layers thereof. In an embodiment, metal pad 48 is formed of Al—Cu. Metal pad 48 may be electrically connected to active circuit 32, for example, through underlying interconnect structure 34.

The metallization layers include a top metallization layer Mtop, which is formed in top dielectric layer 53. Mtop pad 52 is formed in top dielectric layer 53 as a part of top metallization layer Mtop. Top dielectric layer 53 may be formed of un-doped silicate glass or low-k dielectric materials. Mtop pad 52 may either contact metal pad 48 directly, as shown in FIG. 2, or may be connected to metal pad 48 through multiple vias (not shown, similar to vias 54). An additional Mtop-1 pad 56 may be formed directly under Mtop pad 52. Mtop-1 pad 56 may be formed in metallization layer Mtop-1, which is immediately under (one layer below) top metallization layer Mtop. Mtop-1 pad 56 and Mtop pad 52 are connected through a plurality of vias 54. Mtop-1 pad 56 and Mtop pad 52 may have significant portions overlapping each other. In an exemplary embodiment, as shown in FIG. 2, Mtop-1 pad 56 and Mtop pad 52 have a same size and a same shape, and may (or may not) fully overlap each other. In an embodiment, wire bonding may be performed to electrically connect metal pad 48 to metal wire 62, wherein wire bond 60 is illustrated as being formed on metal pad 48. During the wire bonding, the bonding force is applied to metal pad 48, the force will be imparted to Mtop-1 pad 56 through Mtop pad 52, and hence both Mtop pad 52 and Mtop-1 pad 56 structurally support metal pad 48.

CSR structure 10 may include portions in upper metallization layers, for example, in metallization layers Mtop and Mtop-1. In lower metallization layers, for example, from the bottom metallization layer (commonly known as M1) to metallization layer Mtop-2, CSR structure 10 is either smaller in the horizontal size than that in metallization layers Mtop and Mtop-1, or not formed at all. Accordingly, the regions directly under CSR structure 10 may be used for forming interconnect structure 34 and/or active circuit 32, as also shown in FIG. 2.

Figure 3A:
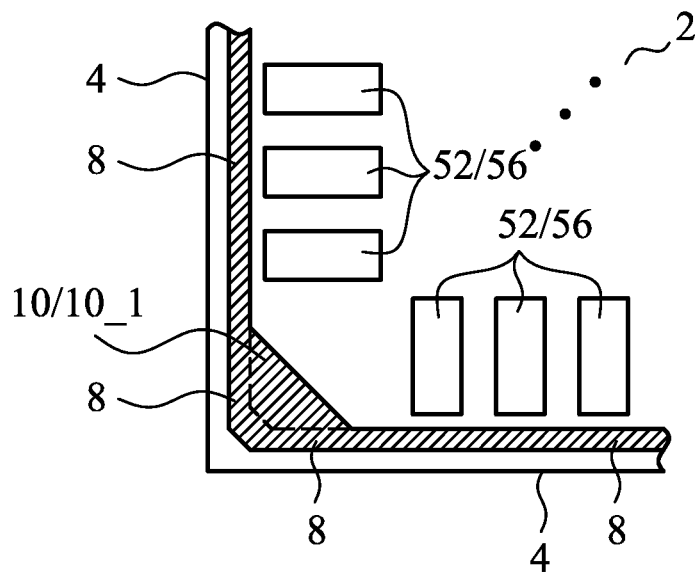
FIG. 3A is a top view of upper metallization layers in a semiconductor chip.
Figure 3B:
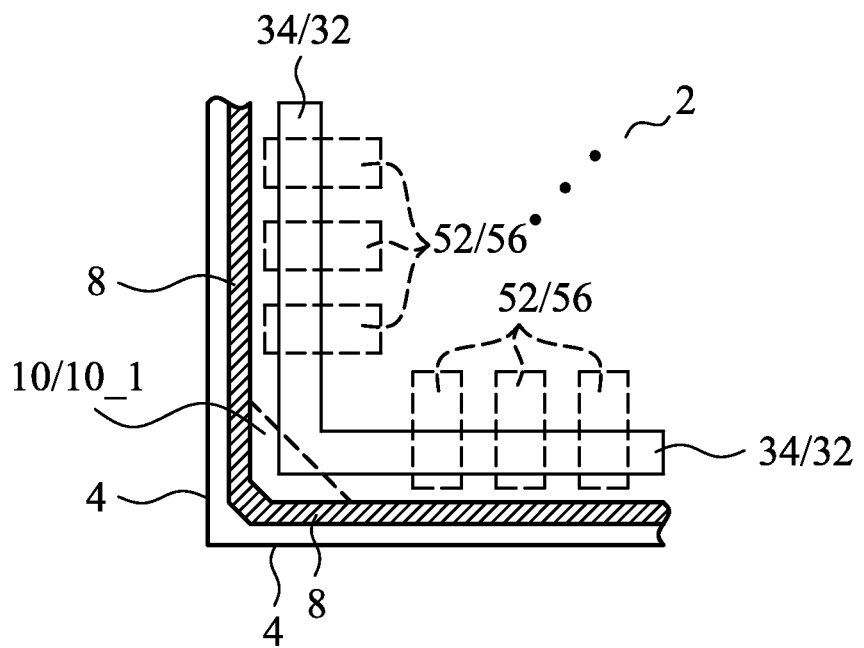
FIGS. 3B and 3C are top views of lower metallization layers in the semiconductor chip.
Figure 3C:
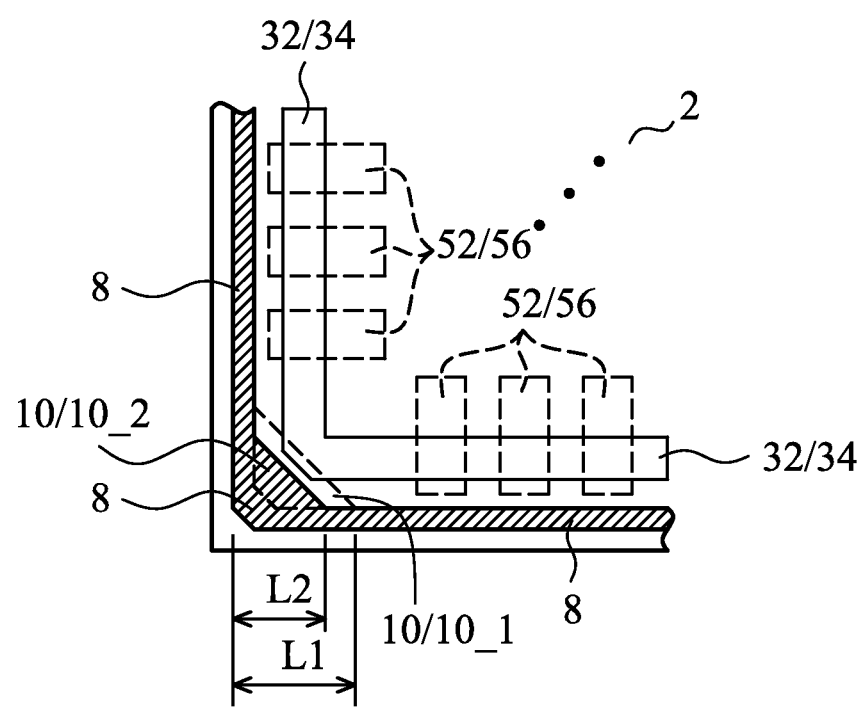

FIGS. 3A through 3C illustrate the top views of seal ring 8 and CSR structure 10 in different metallization layers. Referring to FIG. 3A, seal ring 8 and CSR structure 10 are formed in the upper metallization layers, for example, including metallization layers Mtop and/or Mtop-1. It is noted that Mtop-1 pads 56 are in metallization layer Mtop-1, while Mtop pad 52 are in metallization layer Mtop, although they are shown in a same figure. Further, CSR structure 10 comprises portions 10_1 in metallization layers Mtop and/or Mtop-1.

Referring to FIG. 3B, the top view of seal ring 8 in the lower metallization layers (including metallization layers M1 through Mtop-2) are illustrated. CSR structure 10, Mtop-1 pads 56, and Mtop pads 52 are illustrated using dotted lines since they are only formed in the upper metallization layers higher than metallization layer Mtop-2, and are not in the illustrated lower metallization layer(s) M1 through Mtop-2. In the exemplary embodiment as shown in FIG. 3B, CSR structure 10 does not comprise any portion in the lower metallization layers M1 through Mtop-2. It is noted that interconnect structure 34 and/or active circuit 32 may be formed directly under CSR structure 10/10_1, and may extend directly under Mtop-1 pads 56 and Mtop pads 52. In other words, CSR structure 10 is formed only in the upper metallization layers, while the regions in the lower metallization layers and directly under CSR structure 10 are reserved for forming active circuits and the metal routing structures. Referring back to FIG. 2, it is observed that each of interconnect structure 34 and active circuit 32 may include a portion directly under CSR structure 10.

FIG. 3C illustrates an alternative embodiment, in which the top views of seal ring 8 in the lower metallization layers Mtop-2 through M1 are illustrated. In this embodiment, CSR structure 10, besides portions 10_1 in the upper metallization layers Mtop and/or Mtop-1, also includes portions 10_2 in the lower metallization layers M1 through Mtop-2. However, portions 10_2 of CSR structure 10 in the lower metallization layers have smaller sizes than portions 10_1 of CSR structure 10 in the upper metallization layers. For example, a horizontal dimension of the CSR portion 10_2 in the lower metallization layers is shown as L2, which is smaller than the corresponding horizontal dimension L1 of CSR portion 10_1. In an exemplary embodiment, horizontal dimension L2 is less than about 50 percent, or even less than 20 percent, horizontal dimension L1. As a result, the regions in the lower metallization layers and directly under the upper CSR portions 10_1 may be used for forming active circuit 32 and interconnect structure 34.

The bump pad structure shown in FIG. 2 is referred to as a double-solid pad structure since it includes two metal pads 52 and 56 below and connected to metal pad 48. In alternative embodiments, as shown in FIG. 4, a single-solid pad structure may be formed, which is similar to the structure shown in FIG. 2, except vias 54 and metal pad 56 are not formed. In other words, there is only a single metal pad 52 directly under metal pad 48. In this embodiment, CSR structure 10 (refer to FIG. 3A) may include a portion in the upper metallization layer including metallization layer Mtop, while no CSR structure 10 is formed in the lower metallization layers including layers M1 through Mtop-1. Alternatively, CSR structure 10 includes portions in the lower metallization layers, but the horizontal sizes of the portion in the lower metallization layers are smaller than that in top metallization layer Mtop (please refer to FIG. 3C). Accordingly, the region in the lower metallization layers M1 through Mtop-1 and directly under the portion of CSR structure 10 may include metal lines and vias. In addition, active circuit 32 may be formed directly under CSR structure 10.

The bond pads may also include more than two pads directly underlying metal pad 48. For example, as shown in FIG. 5, bond pads 18 may be triple-solid pads including metal pads in metallization layers Mtop-2, Mtop-1, and Mtop. Accordingly, CSR structure 10 may include portions in the upper metallization layers including Mtop through Mtop-2, while no CSR structure 10 is formed in the lower metallization layers including M1 through Mtop-3. Alternatively, CSR structure 10 may include portions in the lower metallization layers, but the horizontal sizes of the CSR portions in the lower metallization layers are smaller than that in the upper metallization layers. Accordingly, the region in the lower metallization layers and directly under portion 10_1 of CSR structure 10 (refer to FIG. 3C) in the upper metallization layers may include metal lines and vias and/or active circuit 32.

Experiments have been performed to study the effects of stresses. The experiment results revealed that the stresses are highest at the corners of semiconductor chip 2 and in the upper metallization layers, such as Mtop-1 and Mtop, while the stresses at the corners of semiconductor chip 2 and in lower metallization layers are significantly lower. Accordingly, removing or reducing CSR structures from the lower metallization layers has little, if any, effect to the function of releasing stresses. On the other hand, by allowing active circuits and interconnect structures to be formed directly under the CSR structures, the chip areas are saved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a semiconductor chip comprising:
      a corner;
      a seal ring dispatched adjacent edges of the semiconductor chip; and
      a corner stress release (CSR) structure adjacent the corner and physically adjoining the seal ring, wherein the CSR structure comprises:
         a first portion in a top metallization layer; and
         a second portion in a lower metallization layer under the top metallization layer, wherein the lower metallization layer is two layers below the top metallization layer, and wherein the second portion is at least smaller in size than the first portion of the CSR structure;
   a circuit component selected from the group consisting essentially of an interconnect structure and an active circuit directly underlying the first portion of the CSR structure; and
   a dual-solid metal pad comprising:
      a first pad in the top metallization layer;
      a second pad directly underlying the first pad and in a metallization layer one layer below the top metallization layer; and
      a plurality of vias connecting the first pad to the second pad.

2. The integrated circuit structure of claim 1, wherein conductive features of the CSR structure are in physical contact with conductive features of the seal ring.

3. The integrated circuit structure of claim 1, wherein the circuit component comprises the interconnect structure comprising metal lines and vias.

4. The integrated circuit structure of claim 1, wherein the circuit component comprises the active circuit comprising a transistor.

5. The integrated circuit structure of claim 1, wherein the CSR structure does not comprise any portion in the lower metallization layer, and does not comprise any portion in any of additional metallization layers under the lower metallization layer.

6. The integrated circuit structure of claim 1, wherein the second portion of the CSR structure is smaller in size than the first portion of the CSR structure.

7. An integrated circuit structure comprising:
   a semiconductor chip comprising:
      a plurality of metallization layers comprising:
         at least one upper metallization layer comprising a top metallization layer (Mtop); and
         at least one lower metallization layer under the at least one upper metallization layers and comprising a bottom metallization layer (M1);
      a seal ring dispatched adjacent edges of the semiconductor chip;
      a corner stress release (CSR) structure adjacent a corner of the semiconductor chip and physically adjoining the seal ring, wherein the CSR structure comprises a first portion in each of the at least one upper metallization layer, and wherein any portion of the CSR structure in the at least one lower metallization layer is at least smaller in horizontal size than the first portion; and
      an active circuit comprising a transistor directly below the first portion of the CSR structure.

8. The integrated circuit structure of claim 7 further comprising an interconnect structure in the at least one lower metallization layer and directly under the first portion of the CSR structure, wherein the interconnect structure comprises metal lines and vias.

9. The integrated circuit structure of claim 7, wherein the at least one upper metallization layer further comprises a metallization layer (Mtop-1) one layer below the Mtop.

10. The integrated circuit structure of claim 7, wherein the at least one upper metallization layer comprises Mtop only.

11. The integrated circuit structure of claim 7, wherein the at least one upper metallization layer further comprises a metallization layer (Mtop-1) one layer below the Mtop and a metallization layer (Mtop-2) two layers below the Mtop.

12. The integrated circuit structure of claim 7, wherein the CSR structure further comprises a second portion in the at least one lower metallization layer, wherein the second portion has a horizontal size smaller than a horizontal size of the first portion, and wherein the integrated circuit structure further comprises a circuit component selected from the group consisting essentially of an interconnect structure, an active circuit, and combinations thereof.

13. The integrated circuit structure of claim 7 further comprising:
   a dual-solid metal pad comprising:
      a first pad in the Mtop;
      a second pad directly underlying the first pad and in a metallization layer (Mtop-1) one layer below the Mtop; and
      a plurality of vias connecting the first pad to the second pad.

14. An integrated circuit structure comprising:
a semiconductor chip comprising:
- a first edge;
- a second edge perpendicular to the first edge and forming a corner region with the first edge;
- a bond pad adjacent the first edge;
- a seal ring comprising a first side parallel to the first edge and a second side parallel to the second edge;
- a corner stress release (CSR) structure in the corner region and comprising a first end adjoining the first side of the seal ring and a second end opposite the first end adjoining the second side of the seal ring;
- an interconnect structure comprising metal lines and vias directly underlying the CSR structure; and
- an active circuit comprising a transistor directly under the CSR structure.

15. The integrated circuit structure of claim 14, wherein the interconnect structure further extends to directly under the bond pad.

16. The integrated circuit structure of claim 14, wherein the interconnect structure is on an inner side of the seal ring.

17. The integrated circuit structure of claim 7, wherein conductive features of the CSR structure are in physical contact with conductive features of the seal ring.

* * * * *